United States Patent [19]

Mijuskovic

[11] Patent Number: 4,947,135
[45] Date of Patent: Aug. 7, 1990

[54] SINGLE-ENDED CHOPPER STABILIZED OPERATIONAL AMPLIFIER

[75] Inventor: Dejan Mijuskovic, Tempe, Ariz.

[73] Assignee: Motorola, Inc., Schaumburg, Ill.

[21] Appl. No.: 386,060

[22] Filed: Jul. 28, 1989

[51] Int. Cl.$^5$ ............................ H03F 1/02; H03F 3/16
[52] U.S. Cl. ........................................ 330/9; 330/253; 330/277
[58] Field of Search .................. 33/9, 253, 261, 277, 33/301; 307/494, 497

[56] References Cited

U.S. PATENT DOCUMENTS 4,423,385 12/1983 Evans ..................................... 330/9
4,829,263 5/1989 Gulczynski ............................. 330/9

*Primary Examiner*—Steven Mottola
*Attorney, Agent, or Firm*—Michael D. Bingham

[57] ABSTRACT

A single-ended operational amplifier uses a plurality of chopper circuits to alternately transpose matched transistor pairs for cancelling offset errors due to transistor mismatches from statistical process variations. The differential input signals are transposed while simultaneously transposing the currents in a current mirror and in the load devices. The matched devices comprising an output stage remain un-transposed since their contribution to offset error is minimal but their contribution to noise error would be substantial due to the potentially larger voltage differentials existing between them.

10 Claims, 1 Drawing Sheet

SINGLE-ENDED CHOPPER STABILIZED OPERATIONAL AMPLIFIER

FIELD OF THE INVENTION

This invention relates in general to the field of chopper stabilized operational amplifiers and, more particularly, to a single ended operational amplifier having an improved offset voltage using new chopper stabilization techniques which reduces noise and improves bandwidth.

BACKGROUND OF THE INVENTION

Operational amplifiers are widely used in the electronics industry because of their many excellent circuit characteristics including high open loop gain, high input impedance, and low output impedance. General applications of the operational amplifier include circuit configurations such as voltage and current amplifiers, differentiators and integrators, active filters, oscillators, and analog to digital and digital to analog converters. To realize these different circuit configurations, operational amplifiers are used in conjunction with positive and or negative feedback in combination with passive and or active elements.

An operational amplifier is also widely used to function as a voltage comparator, wherein typically, a reference signal is applied to the inverting input and the voltage to be compared is applied to the noninverting input. If the magnitude of the voltage to be compared is greater than the magnitude of the reference signal, the output of the comparator substantially equals the positive supply voltage. If the magnitude of the voltage to be compared is less than the magnitude of the reference voltage, the output of the comparator substantially equals the negative or ground supply voltage. An inverted voltage comparator may be provided by simply transposing the signals at the inverting and noninverting inputs. Using the operational amplifier as a voltage comparator requires no external components or feedback, and its output only has two states of high and low.

The operational amplifier as utilized in the realization of a variety of circuit functions may be manufactured in bipolar or Complementary Metal Oxide Semiconductor (CMOS) technology or some combination thereof. The CMOS implementation is desirable for its high packing density and low power consumption characteristics. Also, operational amplifiers are increasingly being integrated onto chips which merge digital and analog functions together with an increasing number of devices.

A typical problem associated with operational amplifiers is that of an offset error voltage. This type of error appears as deviations in the expected output due to imbalances in the input stage. This is further due to statistical deviations between the devices of the inverting and noninverting inputs. While this offset error is correctable by null offset adjustment, it requires additional circuitry and adds to the manufacturing time. A secondary problem often associated with null offset adjustment is a resulting decrease in the operational amplifier's input common mode range.

Early operational amplifiers provided additional pins to which a variable resistor could be connected for making a null offset adjustment. This had the disadvantages of requiring additional pins on the operational amplifier integrated circuit therein increasing its cost, requiring the additional resistor or trim potentiometer, and increasing the size of the printed circuit board. Also, the operational amplifier and trim potentiometer had different temperature coefficients and would not track over temperature changes causing the null offset to drift. An improved method of null offset adjustment is to trim a resistor on the integrated circuit itself by a laser beam while applying input signals and monitoring the output. This method improves the temperature coefficient problem but requires the additional circuitry, expensive laser beam equipment, reduction in input common mode range, adjustment time, and text fixtures. Due to the aging of the semiconductor, null offset adjustments may drift with no means available to readjust.

If fully differential operational amplifiers are available, versus single ended, an improved method of reducing the null offset error is available by using chopper stabilization techniques. This technique uses a chopper at the input of a first fully differential operational amplifier in order to alternate the application of the inverting and noninverting input signals (transpose) to the first fully differential operational amplifier at some frequency which is at least twice the frequency of the input signal frequency. The outputs of the first fully differential operational amplifier are input into a second chopper for alternating the application of the output signals to a second fully differential operational amplifier. The offset error is reduced because the error is reversed on each transposition of the input and output signals, therein allowing the error due to device mismatches to cancel out. While this technique reduces the offset error, it has the disadvantages of limiting the bandwidth to typically less than 50 kilohertz, introducing switching noise, and requiring fully differential operational amplifiers.

Thus, what is needed is a single ended operational amplifier having an improved offset voltage using chopper stabilization techniques which reduces switching noise and improves bandwidth.

SUMMARY OF THE INVENTION

Accordingly, it is an object of the present invention to provide an improved chopper stabilized, single ended operational amplifier.

It is further an object of the present invention to provide a chopper stabilized operational amplifier having reduced noise.

It is yet a further object of the present invention to provide a chopper stabilized operational amplifier having improved bandwidth.

In carrying out the above and other objects of the invention in one form, there is provided an operational amplifier having an improved offset voltage, comprising a switching circuit coupled between first and second input signals for alternately transposing the coupling of the first and second input signals to a differential input stage that is coupled to the switching circuit. The switching is made at a predetermined frequency being at least twice the frequency of the input signals. An output stage of the operational amplifier is coupled to the differential input stage and coupled to an output terminal having first and second currents, wherein the first and second currents are alternately provided at the output terminal at the predetermined frequency by at least one more switching circuit.

The above and other objects, features, and advantages of the present invention will be better understood from the following detailed description taken in conjunction with the accompanying drawings.

DETAILED DESCRIPTION OF THE INVENTION

Figure 1:
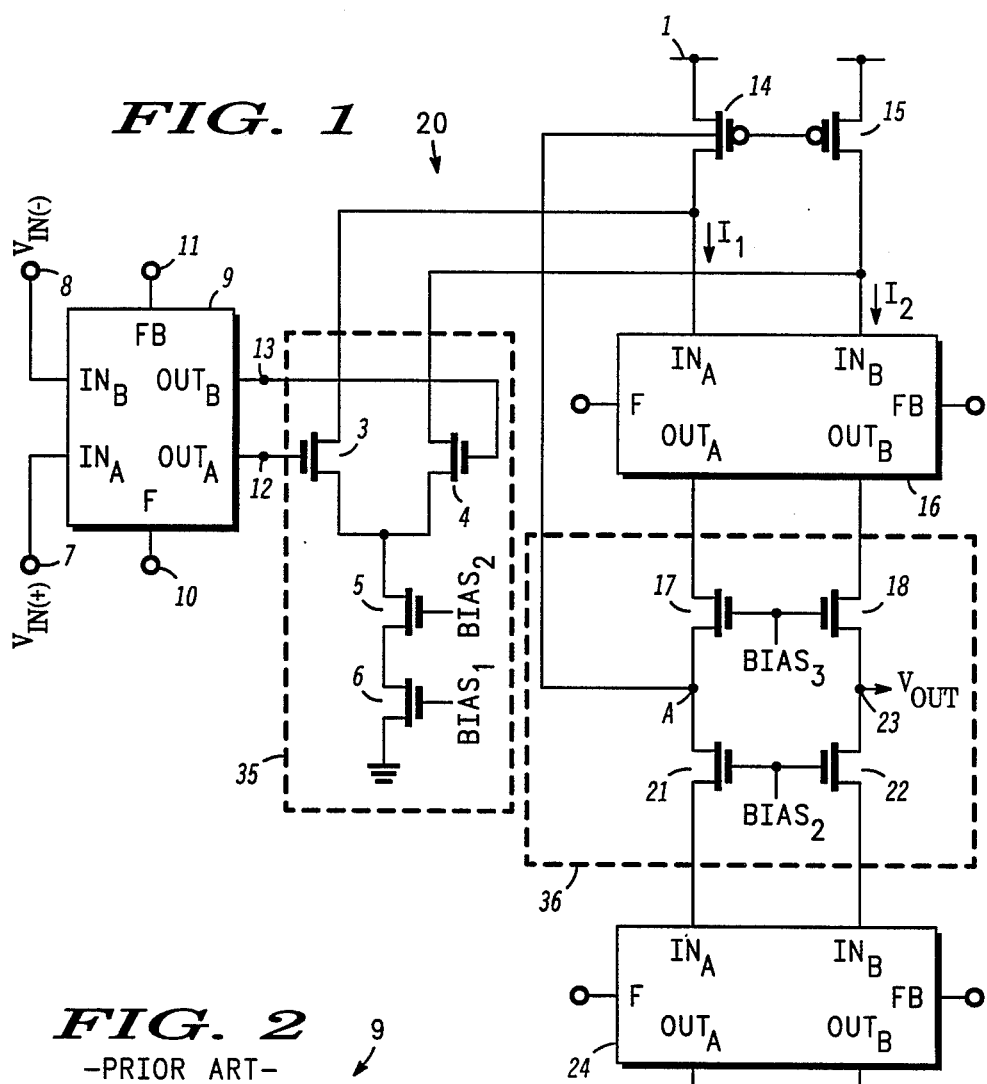
FIG. 1 is a schematic diagram of the present invention.

A single ended, chopper stabilized operational amplifier 20 is shown in FIG. 1 comprising a chopper circuit 9 having input terminals 7 and 8 connected for receiving the input voltages $V_{IN}(+)$ and $V_{IN}(-)$, respectively, at $IN_A$ and $IN_B$, respectively. The chopper 9 has control terminals 10 and 11 connected for receiving complementary control signals F and $F_B$, respectively, and output nodes 12 and 13 for providing chopper signals $OUT_A$ and $OUT_B$, respectively. A chopper circuit is a switching circuit which, for example, provides the input signals at the corresponding output nodes while in a first state ($OUT_A=IN_A$, $OUT_B=IN_B$), and transposes the input signals to the alternate output nodes while in a second state ($OUT_A=IN_B$, $OUT_B=IN_A$). The chopper circuit 9 is shown in more detail in FIG. 2.

Figure 2:
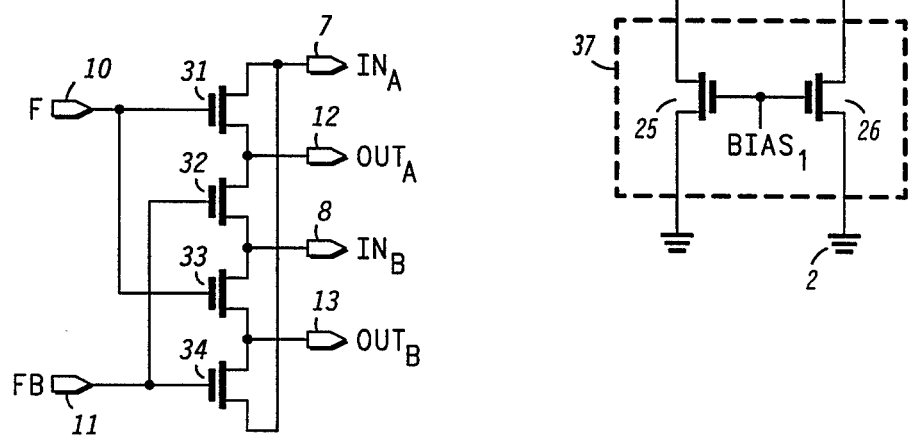
FIG. 2 is a schematic diagram of a chopper circuit.

Referring to FIG. 2, the chopper 9 comprises field effect transistors 31, 32, 33, and 34 wherein the field effect transistor 31 has a source connected to the input terminal 7, a gate connected to the control terminal 10, and a drain connected to the output node 12. The field effect transistor 32 has a source connected to the output node 12, a gate connected to the control terminal 11, and a drain connected to the input terminal 8. The field effect transistor 33 has a source connected to the input terminal 8, a gate connected to the control terminal 10, and a drain connected to the output node 13. The field effect transistor 34 has a source connected to the output node 13, a gate connected to the control terminal 11, and a drain connected to the input terminal 7. When the control signal F is high, the control signal $F_B$ is low and the field effect transistors 31 and 33 are on, thereby providing a low resistance path between $IN_A$ and $OUT_A$, and between $IN_B$ and $OUT_B$, respectively. The field effect transistors 32 and 33 are off therein isolating $IN_A$ from $OUT_B$, and isolating $IN_B$ from $OUT_A$. When control signal F is low, the low resistance path is transposed so that the signal at $IN_A$ appears at $OUT_B$, and the signal at $IN_B$ appears at $OUT_A$.

A differential input stage 35 includes field effect transistors 3, 4, 5, and 6 with the gates of the differential field effect transistors 3 and 4 providing noninverting and inverting inputs, respectively, and connected to the output nodes 12 and 13, respectively. The field effect transistor 5 has a drain connected to the drains of the field effect transistors 3 and 4, and a gate connected for receiving a $BIAS_2$ signal. The field effect transistor 6 has a drain connected to a source of the field effect transistor 5, a gate connected for receiving a $BIAS_1$ signal, and a source connected to a supply voltage terminal 2 for receiving the ground supply voltage. The chopper circuit 9 causes the input signals $V_{IN}(+)$ and $V_{IN}(-)$ to alternately be applied to the noninverting and inverting inputs of the differential input stage 35.

Field effect transistors 14 and 15 form a current mirror for providing currents $I_1$ and $I_2$, respectively, responsive to the input signals $V_{IN}(+)$ and $V_{IN}(-)$. The source of the field effect transistor 14 is connected to a supply voltage terminal 1 for receiving a positive supply voltage, a gate is connected to a node A, and a drain is connected to the source of the field effect transistor 3. The source of the field effect transistor 15 is connected to the supply voltage terminal 1 for receiving the positive supply voltage, a gate is connected to the gate of the field effect transistor 14, and a drain is connected to the source of the field effect transistor 4. A chopper 16 has an $IN_A$ input connected to the drain of the field effect transistor 14, and an $IN_B$ input connected to the drain of the field effect transistor 15. The control inputs F and $F_B$ are connected for receiving the complementary control signals F and $F_B$. The chopper 16 alternately transposes the currents $I_1$ and $I_2$ to first and second current paths formed by the field effect transistors 17 and 21, and 18 and 22, respectively. The chopper 16 is equivalent to the chopper 9 with the exception that all of the devices making up the chopper 16 are P-type devices. As a result, when the control signal F is high, $OUT_A=IN_B$ and $OUT_B=IN_A$ in the chopper 16 which is the opposite state of that for the chopper 9.

The field effect transistors 17, 18, 21, and 22 form an output stage 36 for providing an output signal, $V_{OUT}$, at an output terminal 23. The field effect transistor 17 has a source connected to an $OUT_A$ node of the chopper 16, a gate connected for receiving a $BIAS_3$ signal, and a drain connected to the node A. The field effect transistor 18 has a source connected to an $OUT_B$ node of the chopper 16, a gate connected for receiving the $BIAS_3$ signal, and a drain connected to the output terminal 23. The field effect transistor 21 has a drain connected to the node A and a gate connected for receiving the $BIAS_2$ signal. The field effect transistor 22 has a drain connected to the output terminal 23 and a gate connected for receiving the $BIAS_2$ signal.

A chopper 24 has its inputs $IN_A$ and $IN_B$ connected to the sources of the field effect transistors 21 and 22, respectively, for again alternately transposing the currents $I_1$ and $I_2$ before reaching a load stage 37 made up of the field effect transistors 25 and 26. The chopper 24 has its control terminals F and $F_B$ connected for receiving the complementary control signals F and $F_B$, respectively. The field effect transistors 25 and 26 have their drains connected to the output nodes $OUT_A$ and $OUT_B$, respectively of the chopper 24, their gates connected for receiving the $BIAS_1$ signal, and their sources connected to the supply voltage terminal 2. The load stage 37 provides the single ended output terminal 23 with a reference point to the ground supply voltage.

In operation, when the control signal F is high ($F_B$ is low) the input signals $V_{IN}(+)$ and $V_{IN}(-)$ are applied to the noninverting and inverting inputs (the gates of the field effect transistors 3 and 4, respectively) of the differential input stage 35 which determines the relative magnitudes of the currents $I_1$ and $I_2$, respectively. The current $I_2$ flows through the first current path formed by the field effect transistors 17, 21, and 25, and the current $I_1$ flows through the second current path formed by the transistors 18, 22, and 26. This in turn determines the magnitude of the output voltage $V_{OUT}$. The control signals F and $F_B$ have a frequency of at least twice the frequency of the input signals $V_{IN}(+)$ and $V_{IN}(-)$ in order to satisfy the Nyquist criteria therein avoiding aliasing problems. It is important that the choppers 9, 16, and 24 switch together but their relative phases may changed (i.e., chopper 9 could have its F and $F_B$ inputs transposed).

When the choppers 9, 16, and 24 switch or change states, the magnitude of the current $I_1$ is now determined by input signal $V_{IN}(-)$ and the magnitude of the current $I_2$ is determined by input signal $V_{IN}(+)$. The current $I_2$ now flows through the second current path in the output stage 36 and switches back to the first current path in the load stage 37. Also the current $I_1$ flows through the first current path of the output stage 36 and switches back to the second current path when it reaches the load stage 37. The offset error is created by mismatches in the field effect transistor pairs 3 and 4, 14 and 15, 17 and 18, 21 and 22, and 25 and 26. By transposing the input signals $V_{IN}(+)$ and $V_{IN}(-)$ and the currents $I_1$ and $I_2$, the offset error caused by the field effect transistor pairs 3 and 4, 14 and 15, and 25 and 26 cancel each other out. The offset error introduced by the field effect transistor pairs 17 and 18, and 21 and 22 still exists, but it is well known that these devices produce a much smaller error, for example, approximately 50 microvolts.

The chopper stabilized, single ended operational amplifier 20 not only reduces the offset error, but also provides a further improvement by decreasing the switching noise. This is because the field effect transistors 17, 18, 21, and 22 are not switched by the choppers 9, 16, and 24. The largest voltage differential may exist between the node A and the output terminal 23 and it is the switching of these nodes in conventional chopper stabilized operational amplifiers which introduce most of the switching noise. This switching noise, for example, is typically on the order of 1 millivolt. Because this is avoided, there is substantially less noise introduced and the frequency of operation can be increased. The chopper stabilized, single ended operational amplifier 20 has an improved bandwidth, for example, 1 megahertz. It should be noted that switching noise below the chopper frequency, known as flicker or 1/f noise, is cancelled in this and in conventional chopper stabilized operational amplifiers.

By now it should be appreciated that there has been provided a single ended operational amplifier having an improved offset voltage using chopper stabilization techniques which reduces noise and improves bandwidth.

I claim:

1. An operational amplifier having an improved offset error voltage, comprising:
   an output terminal;
   a differential input stage having noninverting and inverting inputs coupled for receiving first and second input signals;
   first switching means coupled between said differential input stage and the first and second input signals for alternately transposing the coupling of the first and second input signals to said noninverting and inverting inputs of said differential input stage at a predetermined frequency; and
   output means coupled to said differential input stage and coupled to said output terminal for providing an output signal, said output means having first and second current paths and further having first and second currents responsive to the first and second input signals, wherein the first and second currents are alternately transposed in said first and second current paths at the predetermined frequency.

2. An operational amplifier having an improved offset error voltage, comprising:
   an output terminal;
   a differential input stage having noninverting and inverting inputs coupled for receiving first and second input signals;
   first switching means coupled between said differential input stage and the first and second input signals for alternately transposing the coupling of the first and second input signals to said noninverting and inverting inputs of said differential input stage at a predetermined frequency, said first switching means including,
   (a) a first field effect transistor having a source coupled for receiving the first input signal, a gate coupled for receiving a chopper signal, and a drain coupled to the noninverting input of said differential input stage,
   (b) a second field effect transistor having a source coupled to the noninverting input of said differential input stage, a gate coupled for receiving an inverted chopper signal, and a drain coupled for receiving the second input signal,
   (c) a third field effect transistor having a source coupled for receiving the second input signal, a gate coupled to the gate of the first field effect transistor, and a drain coupled to the inverting input of said differential input stage, and
   (d) a fourth field effect transistor having a source coupled to the inverting input of said differential input stage, a gate coupled to the gate of said second field effect transistor, and a drain coupled for receiving the first input signal; and
   output means coupled to said differential input stage and coupled to said output terminal having first and second currents wherein the first and second currents are alternately provided at said output terminal at the predetermined frequency.

3. The operational amplifier according to claim 2 wherein said output means further comprises:
   current mirror means coupled to said differential input stage for providing the first and second currents;
   second switching means coupled to said current mirror means for alternately transposing the first and second currents at said output terminal;
   single ended output stage coupled to said second switching means and coupled to said output terminal for providing an output signal;
   third switching means coupled to said single ended output stage for receiving the first and second currents and alternately transposing the first and second currents; and
   load stage coupled to said third switching means for receiving the first and second currents and for providing a reference to the output signal.

4. A monolithically integrated operational amplifier using chopper techniques for reducing the offset error voltage, comprising:
   a first input terminal for receiving a first input signal;
   a second input terminal for receiving a second input signal;
   an output terminal;
   first chopper means coupled to said first and second input terminals, said first chopper means having first and second states wherein the first state allows the first and second input signals to pass through unchanged, and the second state transposes the coupling of the first and second input signals;
   a differential input stage having inverting and noninverting inputs coupled to said first chopper means for receiving the first and second input signals; and
   output means coupled to said differential input stage and coupled to said output terminal for providing an output signal, said output means having first and second current paths and further having first and second currents responsive to the first and second input signals, wherein the first and second currents are alternately transposed in said first and second current paths.

5. The operational amplifier according to claim 4 wherein said first chopper means comprises:
  a first field effect transistor having a source coupled to said first input terminal, a gate coupled for receiving a chopper signal, and having a drain coupled to the noninverting input of said differential input stage;
  a second field effect transistor having a source coupled to the noninverting input of said differential input stage, a gate coupled for receiving an inverted chopper signal, and having a drain coupled to said second input terminal;
  a third field effect transistor having a source coupled to said second input terminal, a gate coupled to the gate of said first field effect transistor, and a drain coupled to the inverting input of said differential input stage; and
  a fourth field effect transistor having a source coupled to the inverting input of said differential input stage, a gate coupled to the gate of said second field effect transistor, and a drain coupled to said first input terminal.

6. The operational amplifier according to claim 5 wherein said output means comprises:
  current mirror means coupled to said differential input stage for providing the first and second currents;
  second chopper means coupled to said current mirror means and coupled to said first and second current paths, said second chopper means having first and second states for alternately transposing the first and second currents between said first and second current paths;
  third chopper means coupled to said first and second current paths for receiving the first and second currents, said third chopper having first and second states for alternately transposing the first and second currents; and
  load means coupled to said third chopper means for providing a reference to the output signal.

7. A single ended, chopper stabilized operational amplifier having an improved offset voltage, said operational amplifier having first and second input terminals coupled for receiving first and second input signals, and having a third terminal for receiving a chopper signal, comprising:
  an output terminal;
  first chopper means coupled to said first and second input terminals for receiving the first and second input signals, and having first and second chopper nodes wherein the first and second input signals are coupled to the first and second chopper nodes, respectively, when said first chopper means is in a first state, and the first and second input signals are coupled to the second and first chopper nodes, respectively, when said first chopper means is in a second state, the first and second states being controlled by the chopper signal;
  a differential input stage having noninverting and inverting inputs coupled to the first and second chopper nodes, respectively, for receiving the first and second input signals;
  current mirror means coupled to said differential input stage for providing first and second currents having magnitudes responsive to the first and second input signals;
  second chopper means coupled to said current mirror means for receiving the first and second currents, and having first and second chopper nodes wherein the first and second currents are coupled to the second and first chopper nodes, respectively, when said second chopper means is in a first state, and the first and second currents are coupled to the first and second chopper nodes, respectively, when said second chopper means is in a second state, the first and second states being controlled by the chopper signal;
  single ended output means coupled to said second chopper means for receiving the first and second currents and coupled to said output terminal for providing an output signal;
  third chopper means coupled to said single ended output means for receiving the first and second currents, and having first and second chopper nodes wherein the first and second currents are coupled to the first and second chopper nodes, respectively, when said third chopper means is in a first state, and the first and second currents are coupled to the second and first chopper nodes, respectively, when said third chopper means is in a second state, the first and second states being controlled by the chopper signal; and
  load means coupled to said third chopper means for receiving the first and second currents for providing a reference from a ground supply voltage to the output signal.

8. The operational amplifier according to claim 7 wherein said chopper means comprises:
  a first field effect transistor having a source coupled to said first input terminal, a gate coupled for receiving a chopper signal, and having a drain coupled to the noninverting input of said differential input stage;
  a second field effect transistor having a source coupled to the noninverting input of said differential input stage, a gate coupled for receiving an inverted chopper signal, and having a drain coupled to said second input terminal;
  a third field effect transistor having a source coupled to said second input terminal, a gate coupled to the gate of said first field effect transistor, and a drain coupled to the inverting input of said differential input stage; and
  a fourth field effect transistor having a source coupled to the inverting input of said differential input stage, a gate coupled to the gate of said second field effect transistor, and a drain coupled to said first input terminal.

9. The operational amplifier according to claim 8 wherein said differential input stage comprises:
  a fifth field effect transistor having a source coupled to a ground supply voltage, a gate coupled for receiving a first bias voltage, and having a drain;
  a sixth field effect transistor having a source coupled to the drain of said fifth field effect transistor, a gate coupled for receiving a second bias voltage, and having a drain;
  a seventh field effect transistor having a drain coupled to the drain of said sixth field effect transistor, a gate coupled to the first chopper node of said first chopper means, and a drain coupled to said current mirror means; and an eighth field effect transistor having a drain coupled to the drain of said sixth field effect transistor, a gate coupled to the second chopper node of said first chopper means, and a drain coupled to said current mirror means.

10. The operational amplifier according to claim 9 wherein said current mirror means comprises:

a ninth field effect transistor having a source coupled for receiving a positive supply voltage, a gate coupled to said single ended output means, and a drain coupled to the source of said seventh field effect transistor and to said second chopper means for providing the first current; and a tenth field effect transistor having a source coupled for receiving the positive supply voltage, a gate coupled to the gate of said ninth field effect transistor, and a drain coupled to the source of said eighth field effect transistor and to said second chopper means for providing the second current.

* * * * *